US008271252B2

(12) United States Patent
Chatterjee et al.

(10) Patent No.: US 8,271,252 B2
(45) Date of Patent: Sep. 18, 2012

(54) AUTOMATIC VERIFICATION OF DEVICE MODELS

(75) Inventors: Prosenjit Chatterjee, San Jose, CA (US); Kelvin Ng, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 658 days.

(21) Appl. No.: 11/983,704

(22) Filed: Nov. 8, 2007

(65) Prior Publication Data

US 2009/0125290 A1    May 14, 2009

(51) Int. Cl.
*G06F 17/50* (2006.01)

(52) U.S. Cl. .......................... 703/13; 716/106

(58) Field of Classification Search .................. 703/13, 703/14, 15, 16; 716/4, 5, 106
See application file for complete search history.

(56) References Cited

U.S. PATENT DOCUMENTS

| | | | |
|---|---|---|---|
| 2,795,755 A | 6/1957 | Anthes et al. |
| 3,870,953 A | 3/1975 | Boatman et al. |
| 4,700,293 A | 10/1987 | Grone |
| 5,247,689 A | 9/1993 | Ewert |
| 5,258,648 A | 11/1993 | Lin |
| 5,262,719 A | 11/1993 | Magdo |
| 5,409,568 A | 4/1995 | Vasche |
| 5,499,248 A | 3/1996 | Behrens et al. |
| 5,579,510 A | 11/1996 | Wang et al. |
| 5,635,718 A | 6/1997 | DePuydt et al. |
| 5,807,763 A | 9/1998 | Motika et al. |
| 5,818,252 A | 10/1998 | Fullman et al. |
| 5,834,844 A | 11/1998 | Akagawa et al. |
| 5,880,592 A | 3/1999 | Sharpes et al. |
| 5,907,562 A | 5/1999 | Wrape et al. |
| 5,913,034 A | 6/1999 | Malcolm |
| 5,966,021 A | 10/1999 | Eliashberg et al. |
| 5,996,099 A | 11/1999 | Fournel et al. |
| 6,011,748 A | 1/2000 | Lepejian et al. |
| 6,049,900 A | 4/2000 | Fournel et al. |

(Continued)

FOREIGN PATENT DOCUMENTS

DE    19515591    10/1995

OTHER PUBLICATIONS

Chatterjee, Prosenjit, Article entitled: "Streamline Verification Process With Formal Property Verification to Meet Highly Compressed Design Cycle", pp. 674-677, ACM 2005.

(Continued)

*Primary Examiner* — Dwin M Craig
*Assistant Examiner* — Andre Pierre Louis

(57) ABSTRACT

An efficient and cost effective mechanism for generating test files for automatic verification of a device model is disclosed. Uncompleted coverage goals determined based upon simulating processing of a test file by a design model may be expressed as negative assertions for input to a test data generator, where output from the test data generator may used to create a test file for completing all or some of the uncompleted coverage goals. The test data generator may indicate data which causes a property to fail, and therefore, may indicate test data which causes the uncompleted coverage goal to succeed. The initial test file may represent zero code coverage and/or zero functional coverage, thereby enabling the test data generator to automatically create one or more test files for accomplishing the more extensive code coverage goals and/or functional coverage goals. Functional coverage goals may be automatically generated by the test data generator.

23 Claims, 12 Drawing Sheets

U.S. PATENT DOCUMENTS

| | | | |
|---|---|---|---|
| 6,056,784 | A | 5/2000 | Stanion |
| 6,057,698 | A | 5/2000 | Heo et al. |
| 6,081,429 | A | 6/2000 | Barrett |
| 6,085,346 | A | 7/2000 | Lepejian et al. |
| 6,097,087 | A | 8/2000 | Farnworth et al. |
| 6,114,892 | A | 9/2000 | Jin |
| 6,133,744 | A | 10/2000 | Yojima et al. |
| 6,246,252 | B1 | 6/2001 | Malladi et al. |
| 6,247,165 | B1 | 6/2001 | Wohl et al. |
| 6,297,654 | B1 | 10/2001 | Barabi |
| 6,307,162 | B1 | 10/2001 | Masters et al. |
| 6,380,555 | B1 | 4/2002 | Hembree et al. |
| 6,392,432 | B1 | 5/2002 | Jaimsomporn et al. |
| 6,420,888 | B1 | 7/2002 | Griffin et al. |
| 6,429,532 | B1 | 8/2002 | Han et al. |
| 6,472,895 | B2 | 10/2002 | Jaimsomporn et al. |
| 6,472,900 | B1 | 10/2002 | Malladi et al. |
| 6,534,853 | B2 | 3/2003 | Liu et al. |
| 6,590,294 | B1 | 7/2003 | Lee et al. |
| 6,625,784 | B1 | 9/2003 | Ohta et al. |
| 6,686,615 | B1 | 2/2004 | Cheng et al. |
| 6,750,646 | B1 | 6/2004 | Voss et al. |
| 6,788,105 | B2 | 9/2004 | Kono |
| 6,873,927 | B2 | 3/2005 | Chi et al. |
| 6,876,215 | B1 | 4/2005 | Hannan et al. |
| 6,878,172 | B2 | 4/2005 | Jensen |
| 6,884,642 | B2 | 4/2005 | Farnworth et al. |
| 6,914,424 | B2 | 7/2005 | Chi et al. |
| 6,933,524 | B2 | 8/2005 | Hembree et al. |
| 6,990,642 | B2 | 1/2006 | Arakawa |
| 7,216,050 | B1 | 5/2007 | Bachman et al. |
| 7,279,887 | B1 | 10/2007 | King et al. |
| 7,428,715 | B2 * | 9/2008 | Fournier et al. ............... 716/4 |
| 7,444,569 | B2 | 10/2008 | Shidei |
| 7,523,369 | B2 | 4/2009 | Chang |
| 7,636,871 | B1 * | 12/2009 | Blue et al. ............... 714/32 |
| 7,761,751 | B1 | 7/2010 | West |
| 7,765,443 | B1 | 7/2010 | Syed et al. |
| 7,842,948 | B2 | 11/2010 | Schieck et al. |
| 7,919,981 | B2 | 4/2011 | Irie |
| 2001/0006233 | A1 | 7/2001 | Vallett |
| 2001/0010356 | A1 | 8/2001 | Talbot et al. |
| 2002/0016952 | A1 * | 2/2002 | Chang et al. ............... 716/18 |
| 2003/0018945 | A1 * | 1/2003 | Foster et al. ............... 716/5 |
| 2003/0023912 | A1 | 1/2003 | Lesea |
| 2003/0119297 | A1 | 6/2003 | Lam et al. |
| 2003/0124816 | A1 | 7/2003 | Potts |
| 2003/0131717 | A1 | 7/2003 | Shiiya |
| 2005/0166110 | A1 | 7/2005 | Swanson et al. |
| 2005/0229058 | A1 | 10/2005 | Shidei |
| 2007/0016834 | A1 | 1/2007 | Debnath et al. |
| 2008/0092002 | A1 | 4/2008 | Shimooka |
| 2008/0222205 | A1 * | 9/2008 | Lange ............... 707/104.1 |

OTHER PUBLICATIONS

"S. Chakravarthy and V. P. Dabholkar", "Two Techniques for Minimizing Power Dissipation in Scan Circuits During Test Application", Proceedings of the third Asian Test Symposium, Date: Nov. 1994, pp. 324-329.

"R. M. Chou, K. K. Saluja and V. D. Agrawal", "Scheduling Test for VLSI Systems Under Power Constraints", IEE Transactions on Very Large Scale Integration Systems, Date: Jun. 1997, pp. 175-185, vol. 5, No. 2.

"S. Gerstendorfer and H.J. Wunderlich", "Minimized Power Consumption for Scan-Based Bist", International Test Conference, Date: Sep. 1999, pp. 77-84.

"Ranganathan Sankaralingam, B.Pouya, and Nur A. Touba", "Reducing Test Power During Test Using Programmable Scan Chain Disable" 19th IEEE Proceedings of the VLSI Test Symposium, Date: Apr. 2001, pp. 319-324.

"V.P.Dabholkar, S.Chakravarthy, I.Pomeranz and S.Reddy", "Techniques for Minimizing Power Dissipation in Scan and Combinational Circuits During Test Application", IEEE Transaction on Computer-Aided Design of Integrated Circuits and Systems, Date: Dec. 1998, pp. 1325-1333, vol. 17, Issue 12.

"S.Wang and S.K.Gupta", "LT-RTPG: A New Test-Per-Scan Bist TPG for Low Heat Dissipation", International Test Conference, Date: Sep. 1999, pp. 85-94.

"Harald Varnken, Tom Waayers, Nerve Fleury and David Lelouvier", "Enhanced Reduced Pincount Testing for Full-Scan Design", Proceedings of the 2001 International Test Conference, Date: 2001, pp. 738-747.

"D. Heidel et al.,", "High Speed Serializing/De-Serializing Design for Test Method for Evaluating a 1Ghz Microprocessor", Proceedings VLSI Test Symposium, Date: IEEE 1998, pp. 234-238.

"Y.Zorian", "Testing the Monster Chip", IEEE Spectrum, Date: Jul. 1999, pp. 1119-1122.

"Saxena. J, Butler Kenneth. M and Whetsel Lee", "An Analysis of Power Reduction Techiniques in Scan Testing", Proceedings of International Test Conference, 2001, Date: Oct. 2001, pp. 670-677.

* cited by examiner

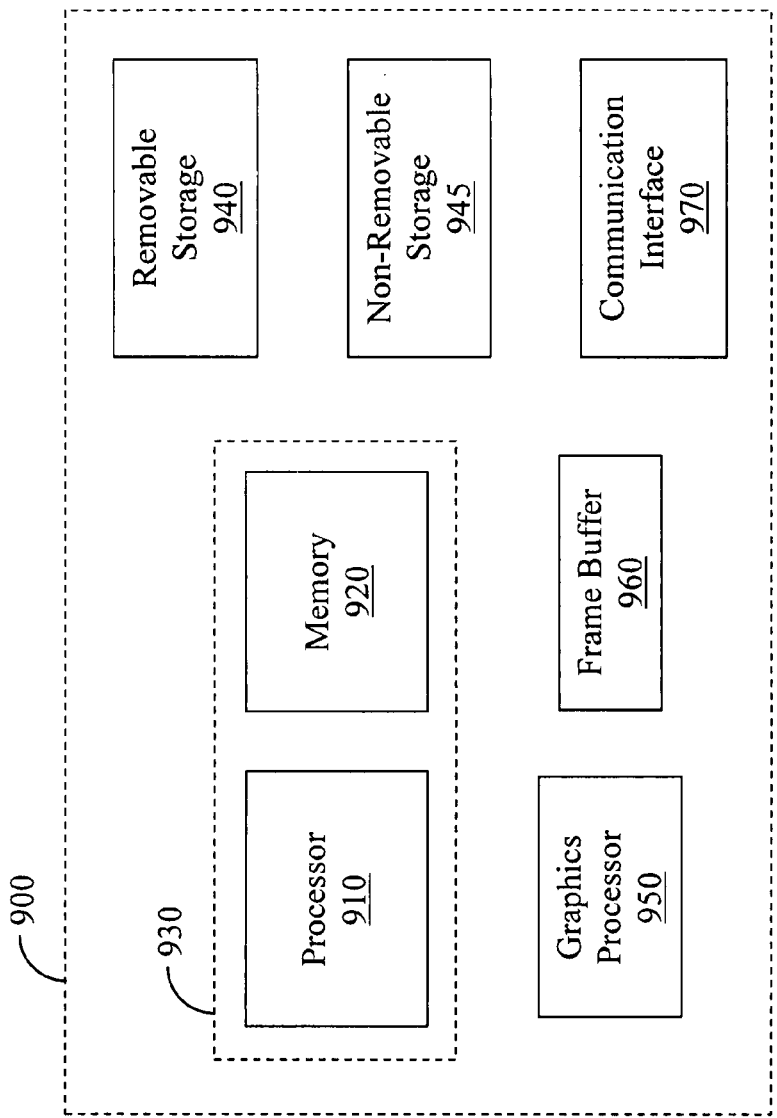

AUTOMATIC VERIFICATION OF DEVICE MODELS

BACKGROUND OF THE INVENTION

Verification of a design is commonly used in the production of integrated circuits for bug-finding and debugging prior to manufacturing the design. Verification is typically performed by applying a test file to a device RTL model and a device reference model, where the output from each may be compared and analyzed. The test file is created by the design or verification engineer in an attempt to exercise various portions of the RTL model code during the verification process. Exercising of the code may be used to complete code coverage goals and/or functional coverage goals.

Prior to comparing the output from the RTL model and the reference model, the test file is created to accomplish code coverage goals and/or functional coverage goals. The functional coverage goals must be specified by the design or verification engineer. Conventional methods of creating test files involve the design or verification engineer writing an initial test file and simulating processing of the test file by the RTL model. Based upon the results of the simulation, the design or verification engineer then writes another test file to increase the code and/or functional coverage of the test file. This process is typically repeated many times until the set of test files is acceptable, or resources allocated to the test file generation effort are expended.

As such, conventional methods for creating test files are very time consuming and costly. Additionally, test files created by conventional methods often provide inadequate code coverage given the extensive skill and experience required to create an acceptable test file using conventional methods of generating test files. Further, inadequate functional coverage is common with conventional methods of generating test files since the design or verification engineer must not only specify functional coverage goals which requires skill and experience, but also write a test file which covers the specified goals.

SUMMARY OF THE INVENTION

Accordingly, a need exists for test files used in verification which may be created more quickly and with less cost. Additionally, a need exists for test files which may be created with less skill and experience. Further, a need exists for test files which implement greater code coverage or functional coverage. Embodiments of the present invention provide novel solutions to these needs and others as described below.

Embodiments provide an efficient and cost effective mechanism for generating test files for automatic verification of a device model. More specifically, uncompleted coverage goals (e.g., code coverage goals and/or functional coverage goals) determined based upon simulating processing of a test file (e.g., comprising manually-written inputs, automatically generated inputs, random inputs, etc.) by a design model (e.g., RTL model or reference model) may be expressed as negative assertions for input to a test data generator (e.g., a formal verification tool, a semi-formal verification tool, etc.), where output from the test data generator may used to create a test file for completing all or some of the uncompleted coverage goals. The test data generator may indicate data which causes a property to fail, and therefore, may indicate test data (e.g., a trace or test file) which causes the uncompleted coverage goal (e.g., expressed as a negative assertion) to succeed (e.g., failure of a negative assertion may comprise a success). Accordingly, test files with increased code and/or functional coverage may be automatically generated in one or more iterations using one or more test data generators. The test data may then be applied to a device RTL model and a device reference model, where comparison of the outputs from the RTL model and the functional model may be used for verification of the RTL model.

Additionally, the initial test file may represent zero code coverage and/or zero functional coverage in one embodiment. As such, little time, skill and experience may be required to create such a test file, thereby enabling the test data generator to automatically create one or more test files for accomplishing the more extensive code coverage goals and/or functional coverage goals. Further, functional coverage goals may be automatically generated by the test data generator, thereby reducing the amount of work required by a design or verification engineer to specify functional coverage goals. One or more test files for accomplishing the automatically generated functional coverage goals may then be automatically created (e.g., by a functional verifier) by expressing the automatically generated functional coverage goals as negative assertions.

In one embodiment, a computer-implemented method of generating test data for verification of a device model includes simulating initial test data applied to the device model. An uncompleted coverage goal is determined based upon the simulation. At least one negative assertion is generated based upon the uncompleted coverage goal. Updated test data is generated based upon the at least one negative assertion, wherein the updated test data is operable to complete the uncompleted coverage goal during simulation of the updated test data applied to the device model. The device model may be selected from a group consisting of a device RTL model (e.g., coded in a HDL such as Verilog, VHDL, etc.) and a device reference model (e.g., coded in C, C++, etc.). The simulating may be performed by a simulator, the determining the uncompleted coverage goal may be performed by a coverage monitor coupled to the simulator, and the generating the updated test data may be performed by a verification tool (e.g., a formal verifier, semi-formal verifier, etc.) operating on the device model and coupled to the simulator. The uncompleted coverage goal may be selected from a group consisting of uncompleted code coverage goals and/or uncompleted functional coverage goals.

Additionally, the above computer-implemented process may also include determining a plurality of uncompleted coverage goals based upon the simulating of the test data. The plurality of uncompleted coverage goals may be partitioned into at least two groups of uncompleted coverage goals. At least one respective negative assertion may be generated for each of the at least two groups of uncompleted coverage goals, wherein the at least one respective negative assertion is based upon the plurality of uncompleted coverage goals. Additional updated test data may be generated based upon the at least one respective negative assertion, wherein the additional updated test data is operable to complete an uncompleted coverage goal of the plurality of uncompleted coverage goals during simulation of the updated test data applied to the device model.

In another embodiment, a computer-implemented method of verifying a device RTL model associated with a device model includes simulating initial test data applied to the device model. An uncompleted coverage goal may be determined based upon the simulating. At least one negative assertion may be generated based upon the uncompleted coverage goal. Updated test data may be generated based upon the at least one negative assertion, wherein the updated test data is operable to complete the uncompleted coverage goal during simulation of the updated test data applied to the device model. The initial test data and the updated test data may be provided as input to the device RTL model. The initial test data and the updated test data may be provided as input to a device reference model associated with the device model. The output from a simulation of the device RTL model may be compared with output from a simulation of the device reference model to verify the device RTL model.

BRIEF DESCRIPTION OF THE DRAWINGS

The present invention is illustrated by way of example, and not by way of limitation, in the figures of the accompanying drawings and in which like reference numerals refer to similar elements.

FIG. 9 shows an exemplary computer system platform upon which embodiments of the present invention may be implemented.

DETAILED DESCRIPTION OF THE INVENTION

Figure 1:
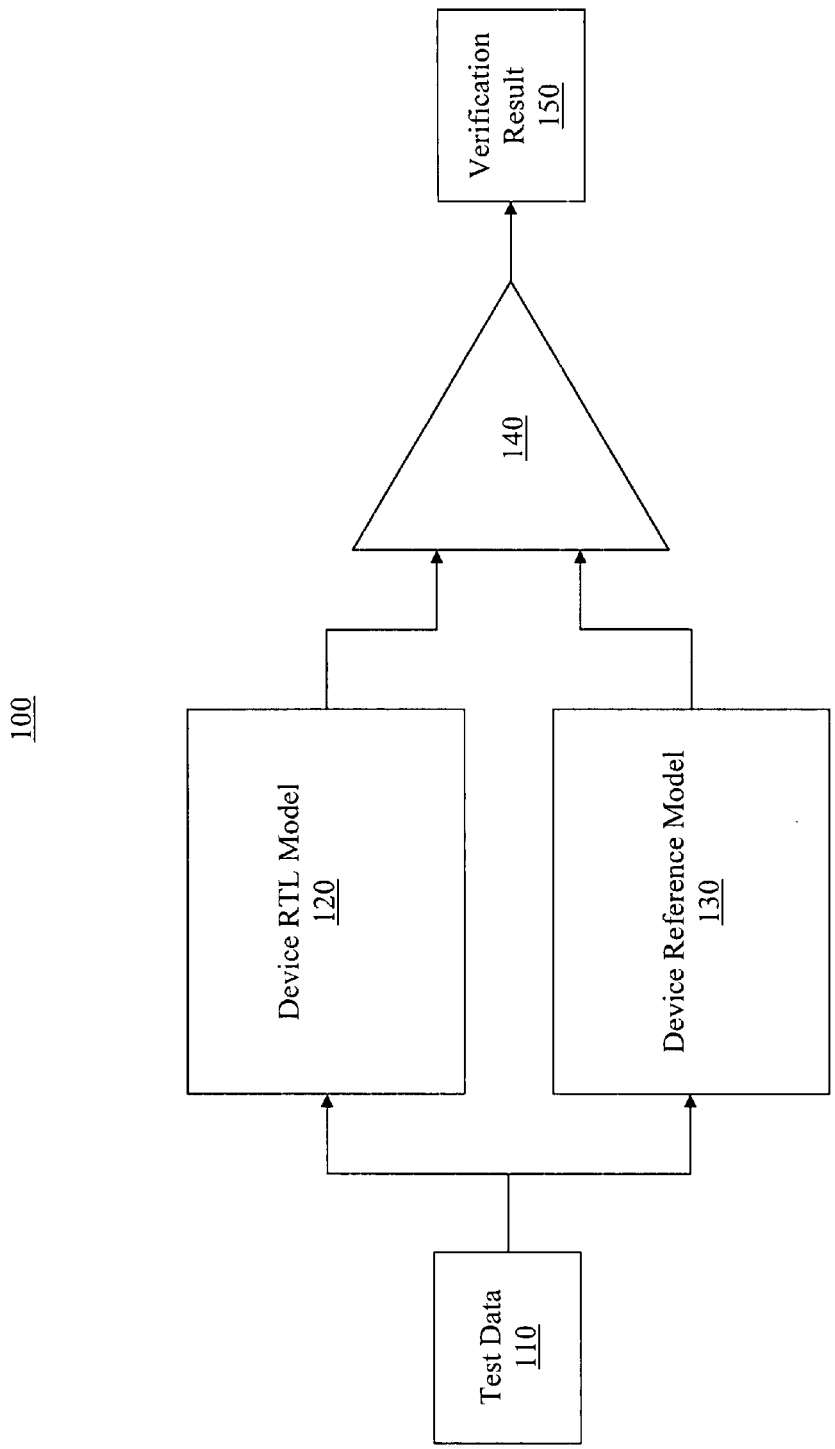
FIG. 1 shows an exemplary system for performing automated verification of a device RTL model in accordance with one embodiment of the present invention.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Notation and Nomenclature

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "accepting," "accessing," "adding," "adjusting," "analyzing," "applying," "assembling," "assigning," "calculating," "capturing," "combining," "commencing," "communicating," "comparing," "collecting," "creating," "defining," "depicting," "detecting," "determining," "displaying," "establishing," "executing," "exiting," "generating," "grouping," "identifying," "initiating," "interacting," "modifying," "monitoring," "moving," "outputting," "performing," "placing," "presenting," "processing," "programming," "providing," "querying," "removing," "repeating," "sampling," "simulating," "sorting," "storing," "subtracting," "tracking," "transforming," "using," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

EMBODIMENTS OF THE INVENTION

FIG. 1 shows exemplary system 100 for performing automated verification of a device RTL model in accordance with one embodiment of the present invention. As shown in FIG. 1, test data 110 may be input to both device RTL model (hereafter referred to as "RTL model") 120 and device reference model (hereafter referred to as "reference model") 130, where reference model 130 may comprise a "functional model" of the device in one embodiment. Output from RTL model 120 and reference model 130 may then be compared by comparator 140. Comparator 140 may output verification result 150 based upon the comparison. Verification result 150 may indicate whether output from RTL model 120 matches the output from reference model 130. Accordingly, system 100 may be used find bugs in the design of RTL model 120, debug RTL model 150, or otherwise automatically verify the performance of RTL model 150.

Although RTL model 120 may be compared to reference model 130 for functional verification of the design in one embodiment, it should be appreciated that output from the reference model (e.g., 130) may be compared with output from another design implementation (e.g., a technical specification net list of the design, a placed and routed net list or circuit associated with the design, etc.). In other embodiments, output form the reference model (e.g., 130) may be compared with output from a physical device (e.g., an integrated circuit based associated with the reference model).

The RTL model (e.g., 120) and reference model (e.g., 130) may be associated with an application-specific integrated circuit (ASIC), graphics processing unit, or other integrated circuit. Additionally, RTL model 120 may be coded in a hardware description language (HDL) such as Verilog, VHDL, etc. Further, in one embodiment, reference model 130 may be coded in C, C++, etc.

As shown in FIG. 1, test data 110 may comprise one or more test files for exercising portions of code in RTL model 120 and/or reference model 130. Each test file may comprise one or more test vectors or other stimulus (e.g., expressed in binary, decimal, hexadecimal, etc.) capable of input to RTL model 120 and/or reference model 130.

Code exercised by the test data (e.g., 110) may be used to determine the code coverage (e.g., line coverage, condition coverage, expression coverage, etc.) associated with test data 110. For example, an amount of code coverage of test data 110 may be determined by the amount of code of RTL model 120 and/or reference model 130 exercised by test data 110. Further, the code coverage associated with test data 110 may be used to determine whether one or more code coverage goals have been completed by test data 110 (e.g., by comparing the code coverage associated with test data 110 with the code coverage associated with the code coverage goal), where a code coverage goal may specify a portion of the code (e.g., a line, condition, expression, etc.) which may be exercised during processing of test data 110 to complete or accomplish the code coverage goal.

Additionally, code exercised by the test data may be used to determine the functional coverage associated with test data 110. For example, functional coverage goals may be defined (e.g., automatically or manually) which relate to how the code (e.g., of RTL model 120 and/or of reference model 130) is exercised. Functional coverage goals may specify an order (e.g., in the same clock cycle, over various clock cycles, etc.) in which portion of code is exercised, whether portions of the code are true or false, or any other manner in which the code may be used or exercised. As such, a functional coverage goal may be determined to be completed or accomplished if test data 110 causes the code to be exercised in accordance with a function coverage goal.

As a further example, the following may comprise exemplary code useful for illustrating code coverage and functional coverage associated with test data 110:

```
if (a)
    b = c
else
    b = d.
```

An exemplary code coverage goal may be to exercise the line "b=c." As such, if test data 110 caused the line "b=c" to be exercised (e.g., by setting a==1), then the code coverage goal may be determined to be accomplished. Additionally, an exemplary functional coverage goal may comprise exercising the line "b=c" in three consecutive clock cycles, which may be expressed as "a && a_prev && a_prev_prev" (e.g., where "a" refers to "a" in a current cycle, "a_prev" refers to "a" in the cycle before the current cycle, and "a_prev_prev" refers to "a" in two cycles before the current cycle). In this manner, the functional coverage goal relates to how the code is exercised. As such, if test data 110 causes the line "b=c" to be exercised in three consecutive clock cycles, then the functional coverage goal may be determined to be accomplished.

Test data 110 may be automatically generated in one embodiment. For example, code coverage goals and/or functional coverage goals may be determined or specified manually (e.g., by a user) and/or automatically. Test data 110 may be automatically generated which completes one or more of the code coverage goals and/or functional coverage goals. Accordingly, embodiments enable automated generation of at least one test file (e.g., test data 110) which exercises code (e.g., of RTL model 120 and/or reference model 130) for completing code coverage goals and/or functional coverage goals specified manually by users, determined automatically, or some combination thereof.

Figure 2:
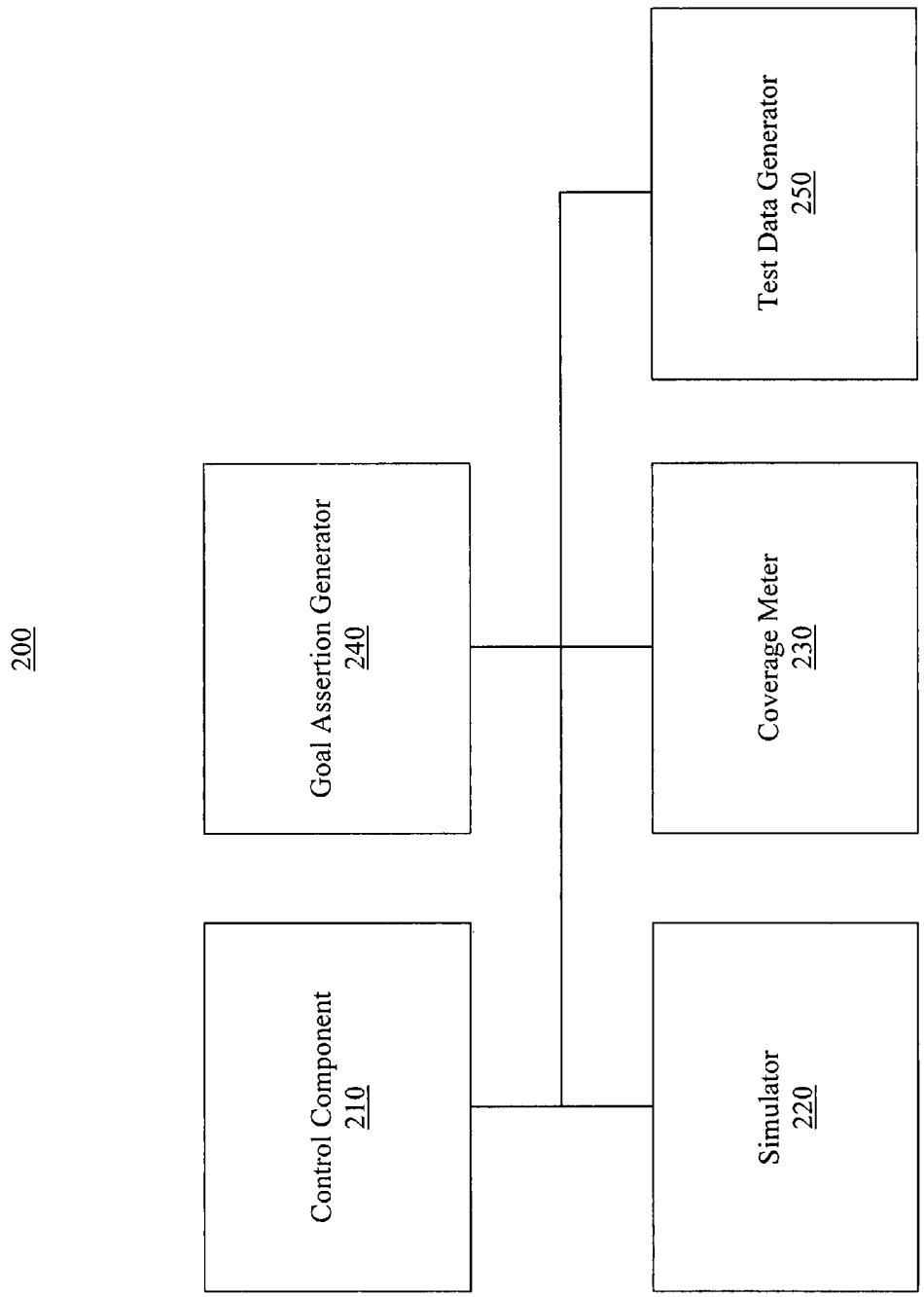
FIG. 2 shows an exemplary system for automatically generating test data in accordance with one embodiment of the present invention.

FIG. 2 shows exemplary system 200 for automatically generating test data in accordance with one embodiment of the present invention. As shown in FIG. 2, control component 210 is coupled to and operable to control other components of system 200 (e.g., simulator 220, coverage meter 230, goal assertion generator 240, test data generator 250, etc.) for automatically generating test data (e.g., 110). Control component 210 may directly control, indirectly control, communicate data between, or otherwise couple other components of system 200. Additionally, control component 210 may interface components of system 200 with other (e.g., external to system 200) systems, devices, components, etc.

Simulator 220 may simulate processing of test data 110 by RTL model 120 and/or reference model 130. Coverage meter 230 may monitor code coverage and/or functional coverage of the code (e.g., of RTL model 120 and/or reference model 130) during the simulation performed by simulator 220. Goal assertion generator 240 may access uncovered or uncompleted coverage goals (e.g., uncompleted code coverage goals and/or uncompleted functional coverage goals) from coverage meter 230, and generate negative assertions based upon the uncompleted coverage goals. The uncompleted coverage goals (e.g., expressed as negative assertions) may be accessed by test data generator 250 (e.g., operable to operate on or otherwise access RTL model 120 and/or reference model 130), which is operable to generate a trace or stimulus for falsifying the negative assertions. Therefore, test data generator 250 may output test data (e.g., 110) for exercising code (e.g., of RTL model 120 and/or reference model 130) to complete or accomplish the uncompleted coverage goals, thereby automatically providing test data (e.g., 110) for increasing code coverage and/or functional coverage.

In one embodiment, the code coverage goal of exercising line "b=c" in the exemplary code discussed above may comprise an uncompleted coverage goal identified by coverage meter 230 during simulation by simulator 220. Goal assertion generator 240 may express the uncompleted code coverage goal as a negative assertion, such as "a!=1," "!(a)" or "never a==1." Test data generator 250 may provide test data which falsifies the negative assertion. For example, test data generator 250 may generate test data to show that "a==1" is possible and that the test data exercises the line "b=c." Therefore, test data generator 250 may generate test data (e.g., 110) which completes the previously uncompleted code coverage goal. It should be appreciated that negative assertions may also be generated for uncompleted functional coverage goals, where test data generator 250 may generate test data (e.g., 110) for completing at least one of the uncompleted functional coverage goals.

Test data generator 250 may create test data for completing uncompleted goals in more than one iteration in one embodiment. For example, a first pass may be made to uncover or otherwise generate test data for completing a first group of uncompleted coverage goals. This first group may comprise easier coverage goals which may be completed in a relatively short amount of time. A second pass may be made in an attempt to complete a second set of uncompleted coverage goals. The second set of uncompleted coverage goals may comprise uncompleted coverage goals which were addressed by test data generator in the previous pass but were skipped (e.g., due to a determination that the goal would take too long to complete, due to a timeout or other condition, etc.), which were not addressed by test data generator 250 in the previous pass (e.g., due to a timeout of the previous pass, due to a delegation of the uncompleted coverage goals to the second pass, etc.), etc. Accordingly, a coverage threshold (e.g., a predetermined amount of code coverage and/or functional coverage) may be met more quickly and with less cost by generating test data (e.g., 110) for easier goals before attempting to generate test data (e.g., 110) for the more difficult goals (e.g., which require more time to generate corresponding test data).

As shown in FIG. 2, system 200 may process test data (e.g., 110) with any amount of associated code coverage and/or functional coverage. For example, initial test data (e.g., 110) operable to complete at least one coverage goal (e.g., code coverage goal and/or functional coverage goal) may be processed by system 100, where test data generator may provide additional test data (e.g., 110) operable to complete at least one additional coverage goal (e.g., code coverage goal and/or functional coverage goal) in one embodiment. It should be appreciated that the initial test data may be generated manually (e.g., by a user) or automatically (e.g., by test data generator 250 in a previous iteration). Alternatively, initial test data (e.g., 110) operable to complete zero coverage goals may be supplied to system 200, where system 200 may process the zero coverage test data until updated test data is generated with increased code coverage and/or functional coverage. In this manner, an initial test file may be written by a user with very little time or effort, thereby enabling system 200 to automatically generate the updated test data (e.g., 110) for completing at least one of the remaining uncompleted coverage goals.

In one embodiment, one or more components of system 200 may automatically generate functional coverage goals based upon access to and/or simulation of the code (e.g., of RTL model 120 and/or reference model 130). For example, test data generator 250 may access the code, determine one or more functional coverage goals, and amend the code with the determined functional coverage goals so that they can be completed in a subsequent iteration using system 200. The automatically generated functional coverage goals may supplement user-supplied functional coverage goals in one embodiment. Alternatively, where a user does not supply functional coverage goals, system 200 may automatically generate functional coverage goals. Test data (e.g., 110) for completing the automatically-generated functional coverage goals may also be generated by system 200 in one embodiment.

As shown in FIG. 2, test data generator 250 may comprise a semi-formal verification tool (e.g., such as Magellan™ from Synopsys, Inc.), formal verification tool, or any other component operable to automatically generate test data (e.g., 110) for completing an uncompleted coverage goal supplied to the component. Additionally, in one embodiment, simulator 220 and coverage meter 230 may be implemented using VCS™ from Synopsys, Inc.

Figure 3:
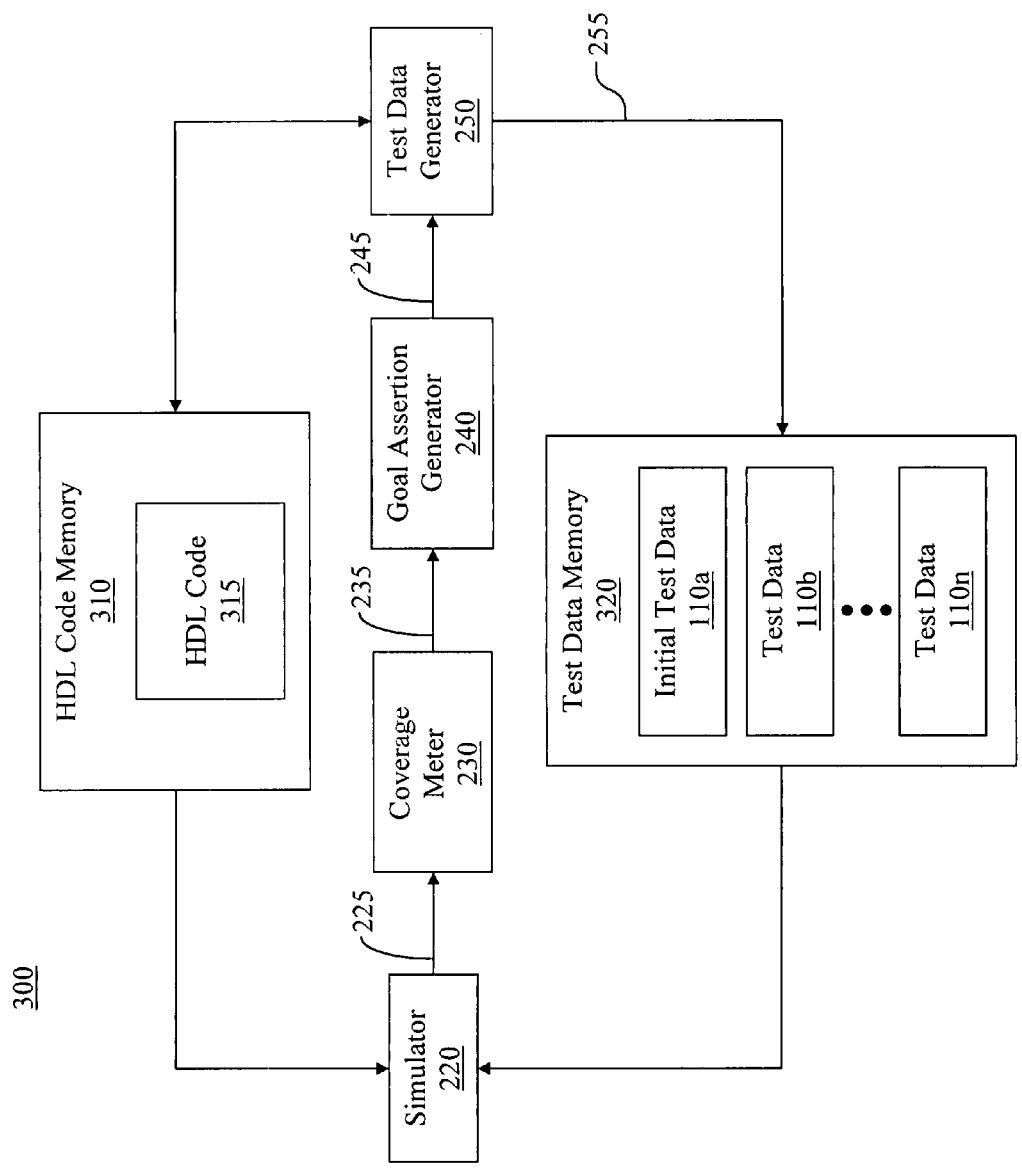
FIG. 3 shows an exemplary data flow diagram for automated generation of test data for exercising RTL model code in accordance with one embodiment of the present invention.

FIG. 3 shows exemplary data flow diagram 300 for automated generation of test data for exercising RTL model code in accordance with one embodiment of the present invention. As shown in FIG. 3, simulator 220 may simulate processing of test data (e.g., initial test data 110*a* accessed from test data memory 320) by an RTL model (e.g., 120) based upon HDL code (e.g., accessed from HDL code memory 310). Coverage meter 230 may access simulation data 225 and generate coverage data 235, where coverage data 235 may indicate which coverage goals (e.g., code coverage goals and/or functional coverage goals) were completed during the simulation and which remain uncompleted. Goal assertion generator 240 may access coverage data 235 and generate modified coverage data 245, where modified coverage data 245 may comprise a negative assertion for each uncompleted coverage goal indicated by coverage data 235.

As shown in FIG. 3, test data generator 250 may access modified coverage data 245 (e.g., representing negative assertions associated with uncompleted coverage goals) and generate updated test data 255 (e.g., by providing test data or stimulus which falsifies the negative assertions). Updated test data 255 may be stored in test data memory 320 (e.g., as test data 110*b*, etc.). Each portion of test data stored in test data memory 320 may represent the test data of a single iteration in one embodiment. Alternatively, portions of test data may be stitched, combined, or otherwise stored together in test data memory 320, and as such, portions of test data within test data memory 320 as depicted in FIG. 3 may represent test data from more than one iteration.

Test data generator 250 may also access HDL code 315 (e.g., from HDL code memory 310) for use in generating test data 255. For example, test data generator 250 may analyze HDL code 315 for determining a stimulus for completing a given coverage goal. For example, using the example discussed above, if a code coverage goal comprises exercising the line "b=c," then HDL code 315 may be accessed to determine which expressions, conditions, etc., may cause a stimulus to exercise the line "b=c." In the above example, the condition "if (a)" may be accessed to enable test data generator 250 to generate a stimulus (e.g., test data 255) to falsify the property and complete the code coverage goal.

Test data generator 250 may also access HDL code 315 to analyze and automatically determine functional coverage goals as discussed above. In one embodiment, HDL code 315 and/or other data within HDL code memory 310 may be accessed to amend the HDL code (e.g., 315) with the automatically-generated functional coverage goals.

As shown in FIG. 3, simulator 220 may then access test data from test data memory 320 and HDL code from HDL code (e.g., 315) memory 310 to begin the next iteration of the process described above. The test data accessed from test data memory 320 may comprise test data which has already been accessed in a previous iteration (e.g., to verify that coverage goals are completed based upon the test data) and/or data which has not yet been accessed in a previous iteration. Additionally, HDL code (e.g., 315) accessed from HDL code memory 310 may comprise one or more uncompleted functional coverage goals, thereby enabling the automated generation of test data for completing at least one of these uncompleted functional coverage goals.

Figure 4A:
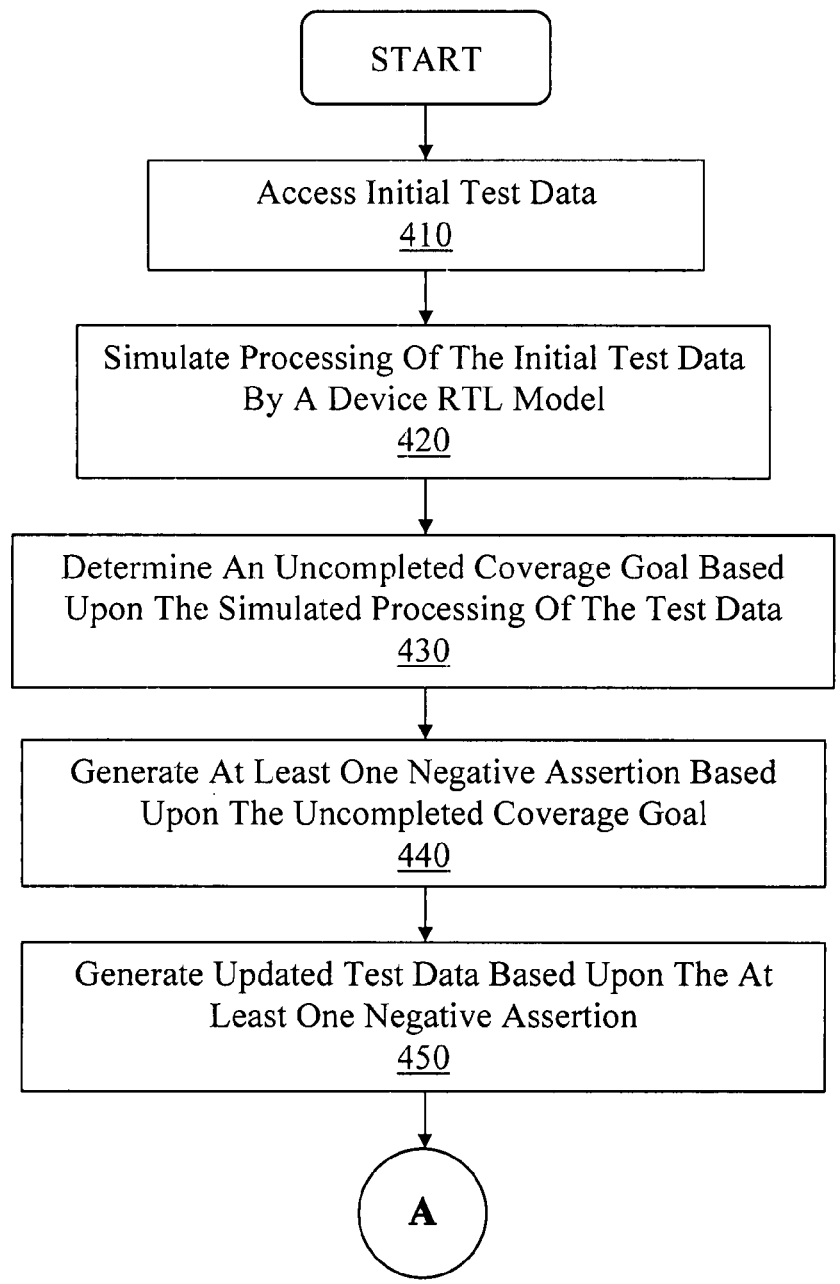
FIG. 4A shows a first portion of an exemplary computer-implemented process for automatically generating test data for exercising RTL model code in accordance with one embodiment of the present invention.
Figure 4B:
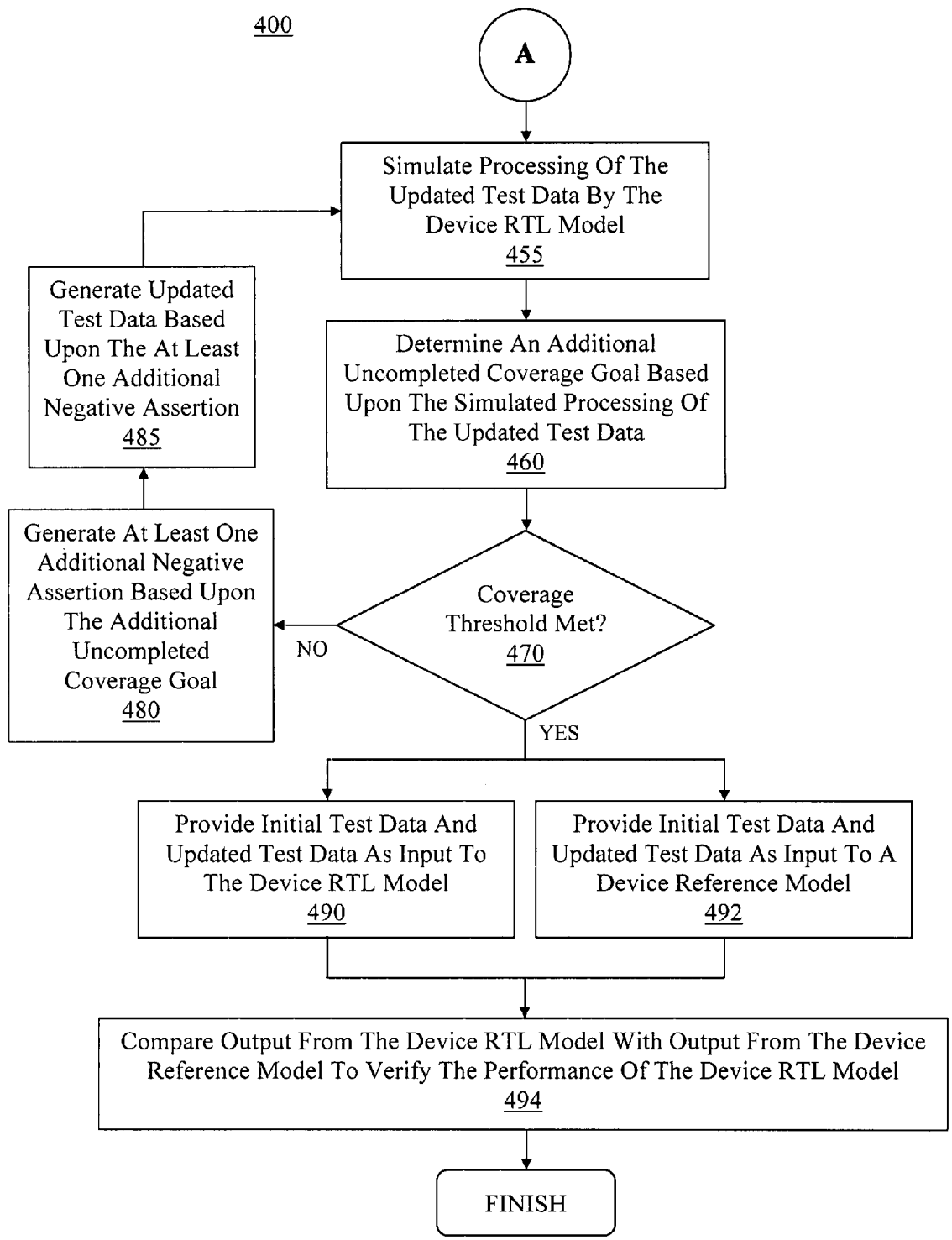
FIG. 4B shows a second portion of an exemplary computer-implemented process for automatically generating test data for exercising RTL model code in accordance with one embodiment of the present invention.

FIGS. 4A and 4B show exemplary computer-implemented process 400 for automatically generating test data for exercising RTL model code in accordance with one embodiment of the present invention. As shown in FIG. 4A, step 410 involves accessing initial test data. The initial test data (e.g., 110, 110a, 110b, etc.) may comprise manually-generated test data (e.g., prepared by a user for completing one or more code coverage goals, functional coverage goals, etc.), automatically-generated test data (e.g., produced by test data generator 250, etc.), random input data, etc. Additionally, the initial test data (e.g., 110, 110a, etc.) may be accessed from a test data memory (e.g., 320) in one embodiment.

Step 420 involves simulating processing of the initial test data (e.g., 110, 110a, etc.) by a device RTL model (e.g., 120). The RTL model may be coded in a HDL such as Verilog, VHDL, etc. Additionally, the simulation may be performed by a simulator (e.g., 220) in one embodiment.

As shown in FIG. 4A, step 430 involves determining an uncompleted coverage goal based upon the simulated processing of the test data (e.g., 110, 110a, etc.). The uncompleted coverage goal may comprise a code coverage goal and/or a functional coverage goal. Additionally, the uncompleted coverage goal may be determined by a coverage meter (e.g., 230) in one embodiment.

Step 440 involves generating at least one negative assertion based upon the uncompleted coverage goal. The negative assertion may be generated by a goal assertion generator (e.g., 240) in one embodiment.

As shown in FIG. 4A, step 450 involves generating updated test data based upon the at least one negative assertion. The updated test data (e.g., 110, 110b, etc.) may be generated by a test data generator (e.g., 250) in one embodiment. Additionally, where the test data generator (e.g., 250) comprises a formal verifier or semi-formal verifier (e.g., operable to operate on or otherwise access RTL model 120 and/or reference model 130), the verifier may generate output (e.g., updated test data) which comprises a trace or stimulus for falsifying the negative assertion. Falsification of the negative assertion may be analogous to completing an coverage goal, and thus, the trace or stimulus (e.g., updated test data) may enable a simulator (e.g., simulating RTL model 120 and/or reference model 130) to complete the previously-uncompleted coverage goal in one embodiment.

As shown in FIG. 4B, step 455 involves simulating processing of the updated test data by the RTL model. The simulation may be performed analogously to that of step 420 discussed above in one embodiment.

Step 460 involves determining an additional uncompleted coverage goal based upon the simulated processing of the updated test data. Step 460 may be performed analogously to step 430 in one embodiment.

As shown in FIG. 4B, step 470 involves determining whether a coverage threshold has been met. The coverage threshold may be a predetermined amount of code coverage and/or functional coverage in one embodiment. Additionally, the respective coverage associated with one or more test files may be summed and compared against the coverage threshold in one embodiment. If the coverage threshold is not met, then step 480 may be performed.

Step 480 involves generating at least one additional negative assertion based upon the additional uncompleted coverage goal (e.g., determined in step 460). Step 480 may be performed analogously to step 440 in one embodiment.

As shown in FIG. 4B, step 490 involves generating updated test data based upon the at least one additional negative assertion (e.g., generated in step 480). Step 485 may be performed analogously to step 450 in one embodiment. Thereafter, steps 455 through 470 may be repeated.

If the coverage threshold in step 470 is met, then steps 490 and 492 may be performed. Step 490 involves providing the initial test data and the updated test data as input to the RTL model (e.g., 120). Step 492 involves providing the initial test data and the updated test data as input to a reference model (e.g., 130). Thereafter, the output from simulation of the RTL model may be compared with the output from simulation of the reference model in step 494 to verify the performance of the RTL model.

Figure 5:
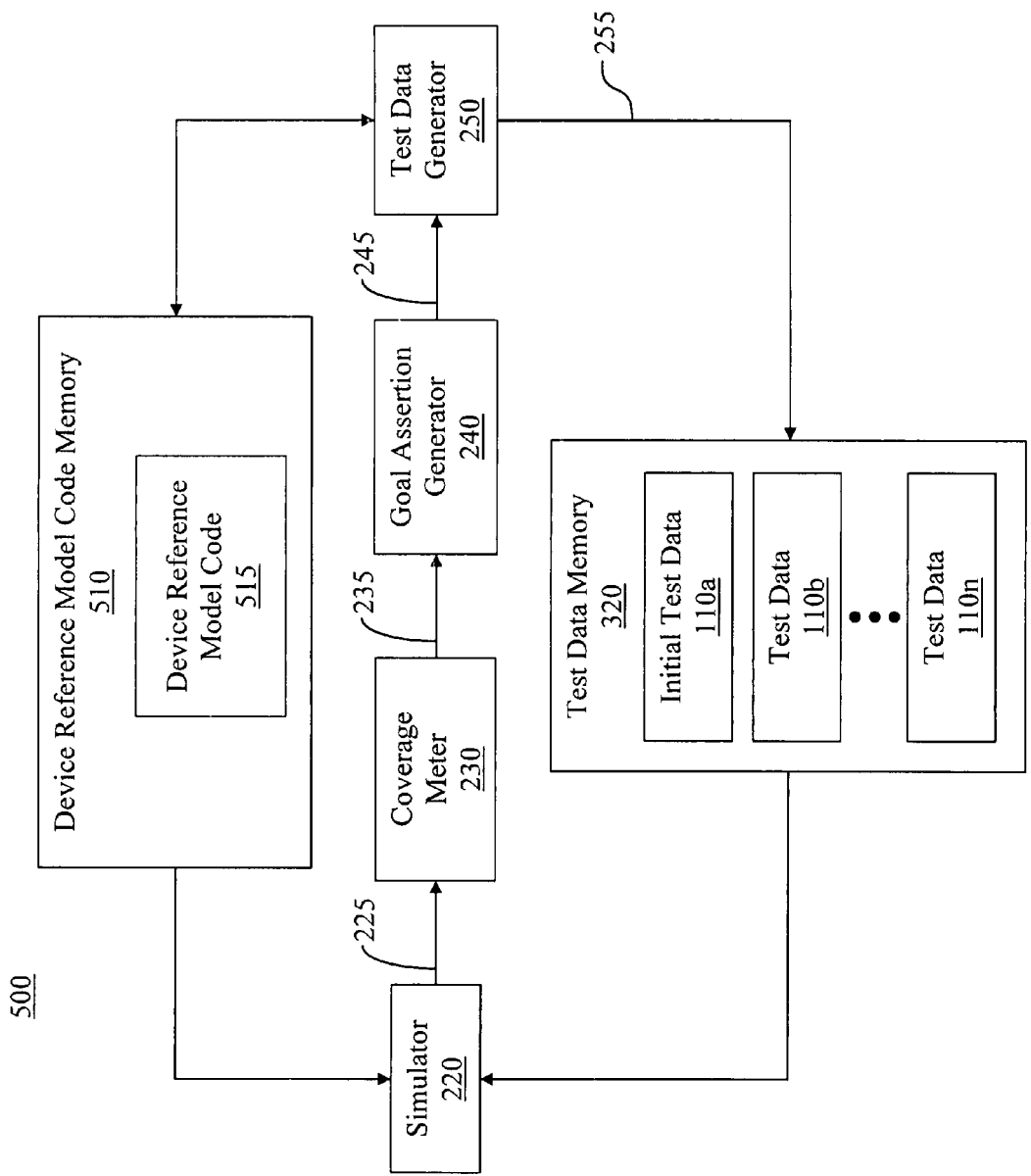
FIG. 5 shows an exemplary data flow diagram for automated generation of test data for exercising reference model code in accordance with one embodiment of the present invention.

FIG. 5 shows exemplary data flow diagram 500 for automated generation of test data for exercising reference model code in accordance with one embodiment of the present invention. Test data (e.g., 110, 110a, 110b, etc.) may be accessed and processed as depicted by diagram 500 similarly to that of diagram 300 of FIG. 3. However, instead of performing the processing (e.g., simulation by simulator 220, test data generation by test data generator 250, etc.) in accordance with HDL code (e.g., 315) accessed from HDL code memory 310 as depicted in FIG. 3, processing is performed in diagram 500 in accordance with device reference model code (e.g., 515) accessed from device reference model code memory 510 as depicted in FIG. 5. Device reference model code 515 may be used to implement device reference model 130 in one embodiment. Accordingly, diagram 500 may be used to complete at least one uncompleted coverage goal (e.g., uncompleted code coverage goal and/or uncompleted functional coverage goal) by creating test data (e.g., 100, 110a, 110b, etc.) operable to exercise portions (e.g., lines, conditions, expressions, etc.) of device reference model code.

Figure 6A:
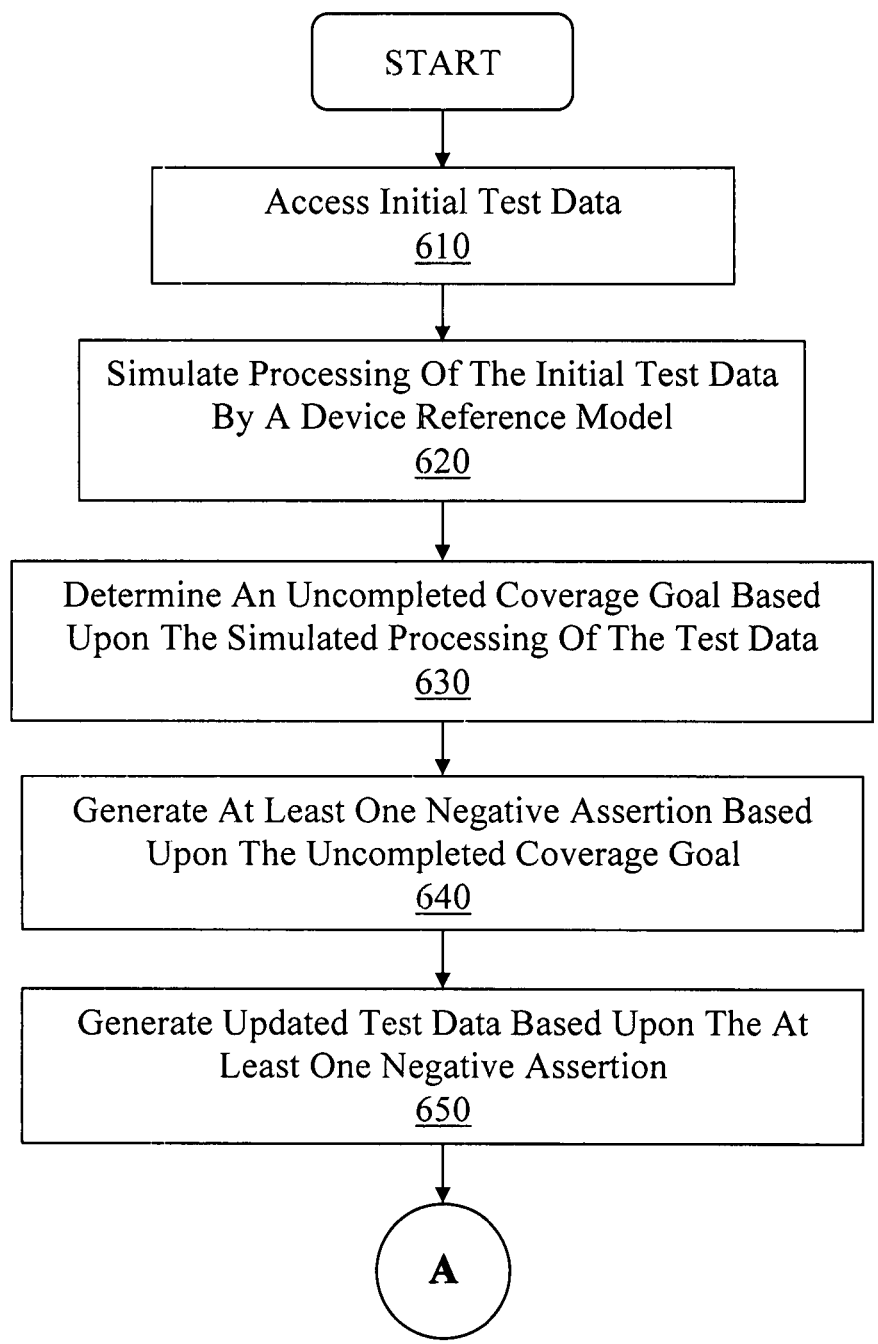
FIG. 6A shows a first portion of an exemplary computer-implemented process for automatically generating test data for exercising reference model code in accordance with one embodiment of the present invention.
Figure 6B:
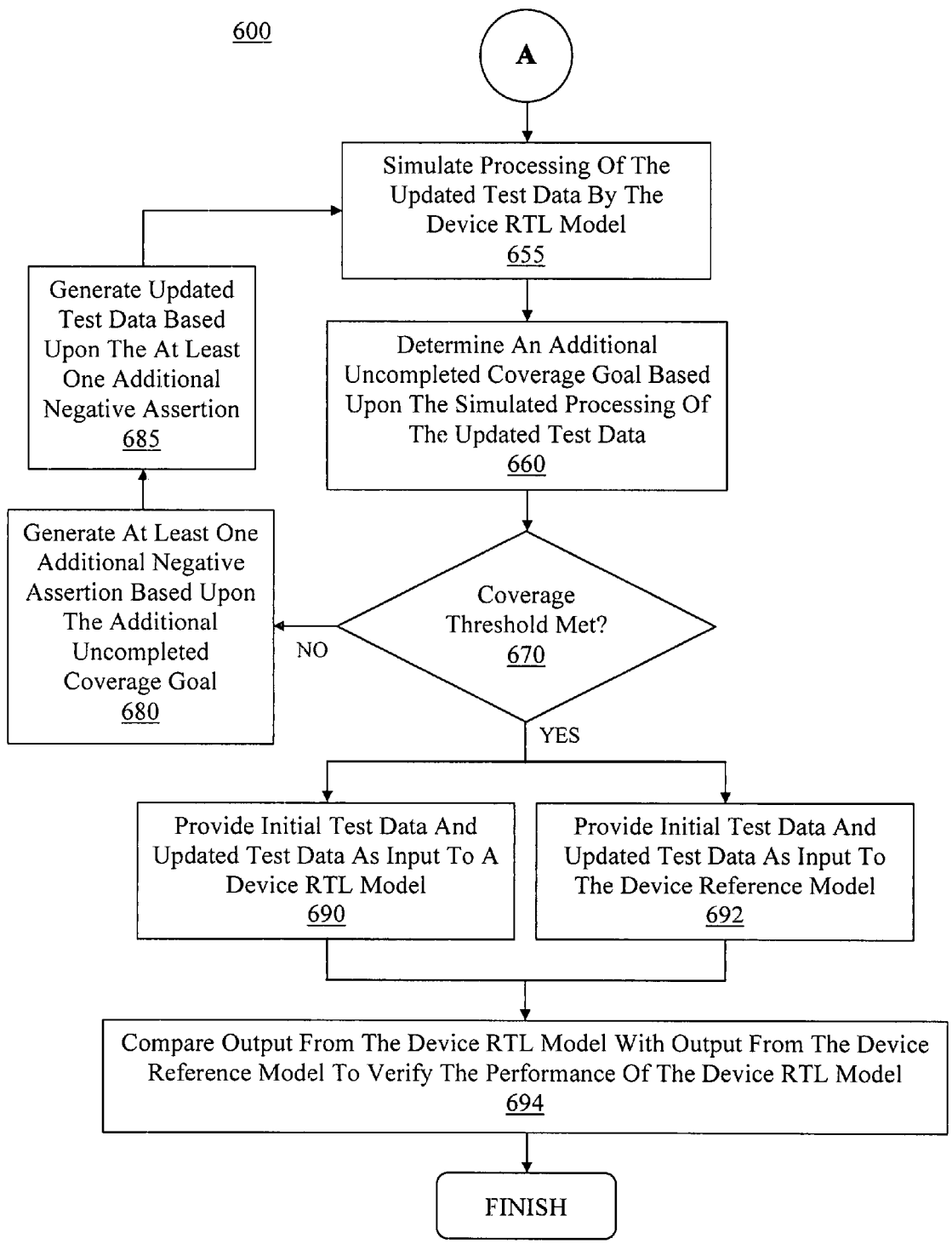
FIG. 6B shows a second portion of an exemplary computer-implemented process for automatically generating test data for exercising reference model code in accordance with one embodiment of the present invention.

FIGS. 6A and 6B show exemplary computer-implemented process 600 for automatically generating test data for exercising reference model code in accordance with one embodiment of the present invention. As shown in FIGS. 6A and 6B, steps of process 600 may be performed similarly to corresponding steps of process 400 of FIG. 4. However, instead of performing the processing in accordance with code (e.g., HDL code 315) for implementing an RTL model (e.g., 120) as discussed above with respect to process 400 of FIGS. 4A and 4B, process 600 involves processing in accordance with code (e.g., device reference model code 515) for implementing a reference model (e.g., 130).

Figure 7:
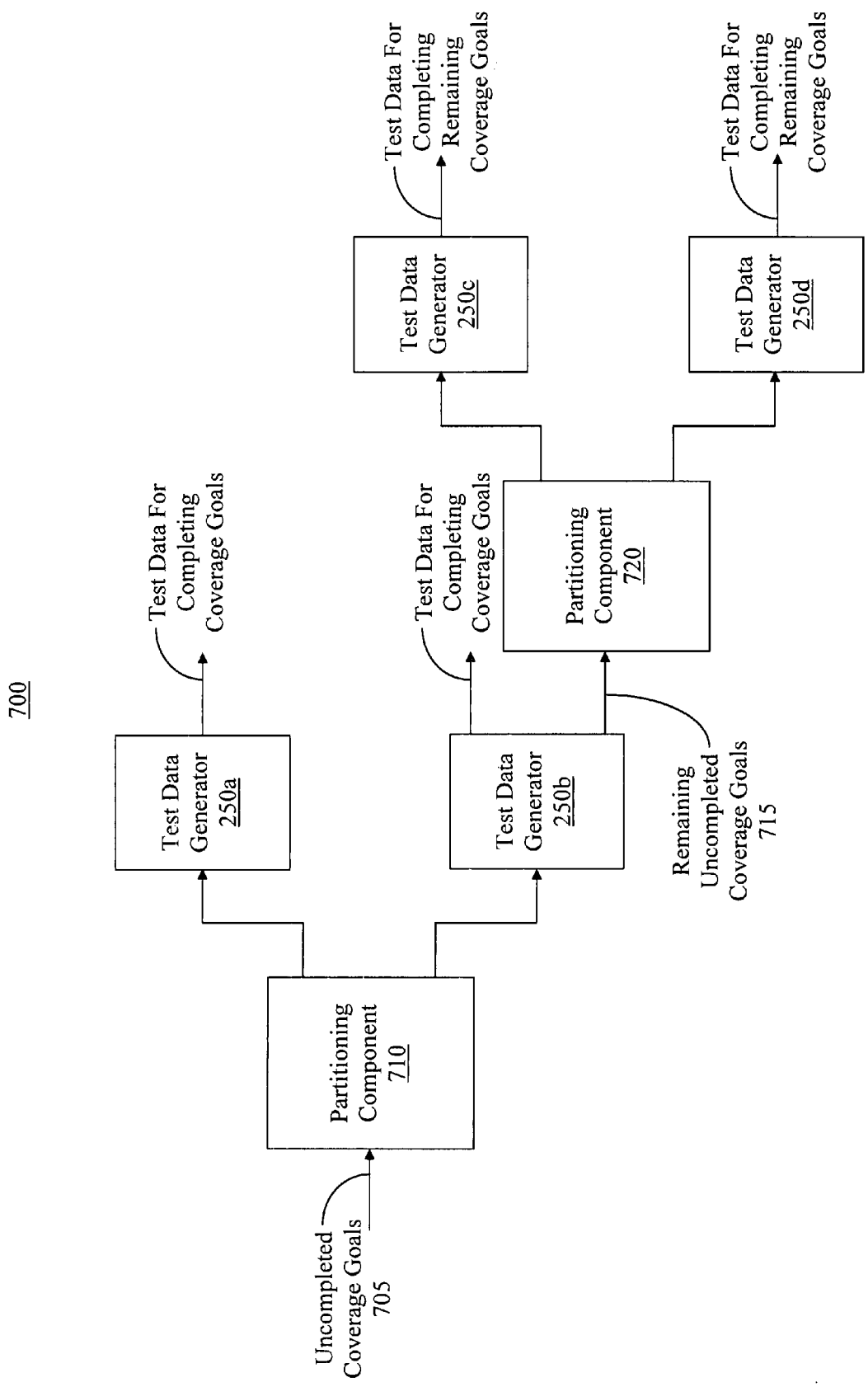
FIG. 7 shows an exemplary data flow diagram for partitioning of coverage goals in accordance with one embodiment of the present invention.

FIG. 7 shows exemplary data flow diagram 700 for partitioning of coverage goals in accordance with one embodiment of the present invention. As shown in FIG. 7, uncompleted coverage goals 705 may be partitioned by partitioning component 710, while remaining uncompleted coverage goals 715 may be partitioned by partitioning component 720. The partitioning components (e.g., 710, 720, etc.) may access coverage data 235 (e.g., prior to generation of negative assertions by goal assertion generator 240). Alternatively, the partitioning components (e.g., 710, 720, etc.) may access modified coverage data 245 (e.g., expressed as negative assertions).

As shown in FIG. 7, partitioning component 710 may partition uncompleted coverage goals 705 into a first group allocated to test data generator 250a and a second group allocated to test data generator 250b. As depicted in FIG. 7, test data generator 250a may generate test data for completing all coverage goals of the first group. Alternatively, test data generator 250b may generate test data for completing only some of the coverage goals of the second group, while remaining uncompleted coverage goals 715 are communicated partitioning component 720 for further partitioning.

Partitioning component 720 may partition remaining uncompleted coverage goals 715 into a third group allocated to test data generator 250c and a fourth group allocated to test data generator 250d. As depicted in FIG. 7, test data generator 250c may generate test data for completing all coverage goals of the third group. Similarly, test data generator 250d may generate test data for completing all coverage goals of the fourth group.

In one embodiment, uncompleted coverage goals may be partitioned or grouped based upon their difficulty and/or the time to generate test data to complete the goals. Alternatively, the uncompleted goals may be partitioned based upon characteristics of the goals or code itself (e.g., similar expressions, conditions, etc. may be grouped together for processing a test data generator). The uncompleted goals may be partitioned based upon characteristics of the test code generator to which a group of uncompleted goals is assigned in another embodiment.

Partitioning of the goals to multiple test data generators (e.g., 250, 250a, 250b, etc.) may expedite generation of the test data (e.g., 110, 110a, 110b, etc.) by enabling the test data generators to work in parallel in one embodiment, thereby saving time and reducing cost by making the generation of the test data more efficient. Similarly, by reducing the time required to generate the test data, the time and cost associated with any verification processes (e.g., 490-494 of process 400, steps 690-694 of process 600, etc.) utilizing the test data may also be reduced.

Although FIG. 7 shows only two partitioning components (e.g., 710 and 720), it should be appreciated that a larger or smaller number of partitioning components may be used in other embodiments. Additionally, it should be appreciated that each partitioning component may partition uncompleted coverage goals into more than two groups in other embodiments. Further, it should be appreciated that each test data generator may perform different functions and/or a different amount of work (e.g., test generator 250a may only complete some goals while communicating remaining goals to one or more other test data generators) in other embodiments.

Figure 8A:
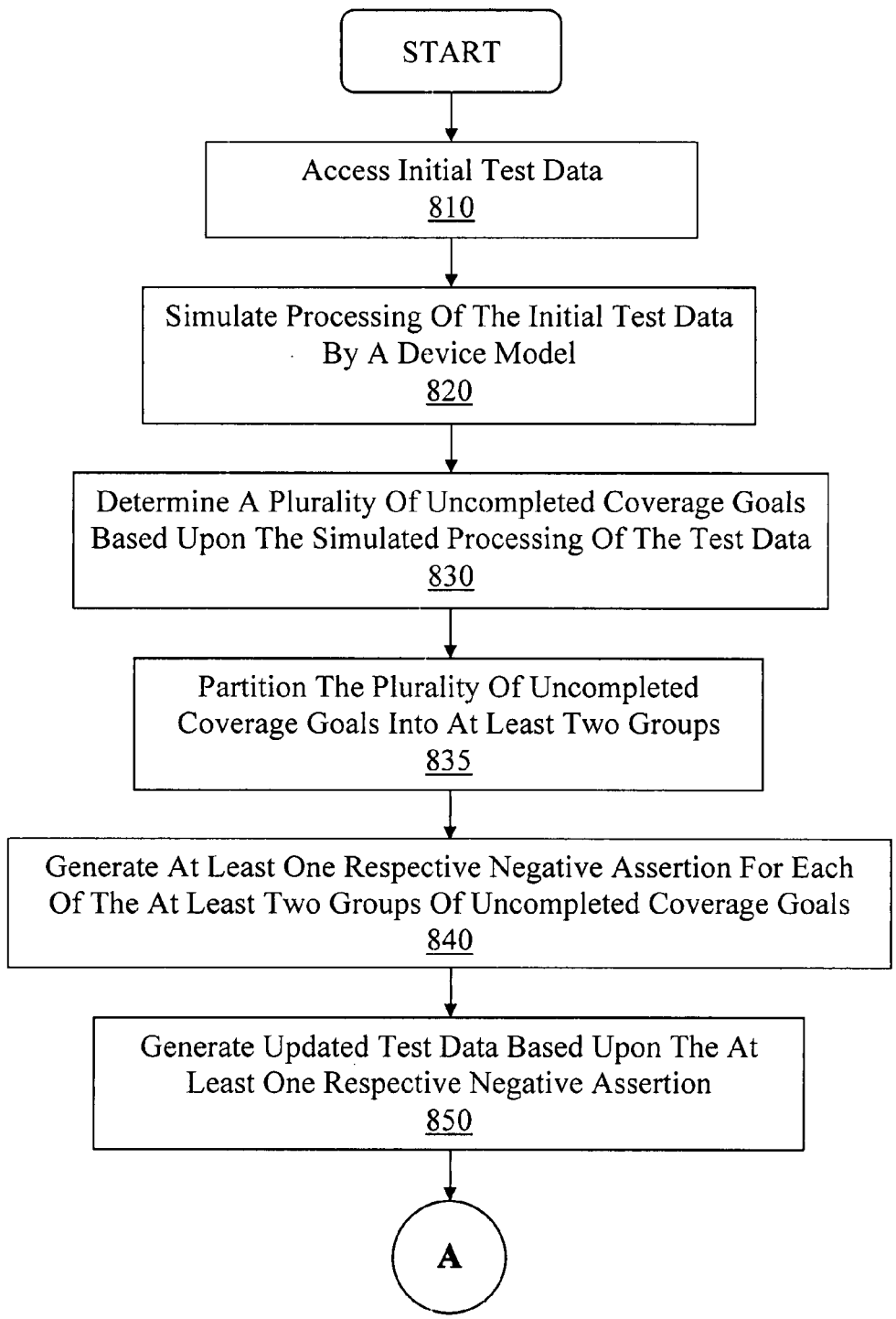
FIG. 8A shows a first portion of an exemplary computer-implemented process for partitioning of coverage goals in accordance with one embodiment of the present invention.
Figure 8B:
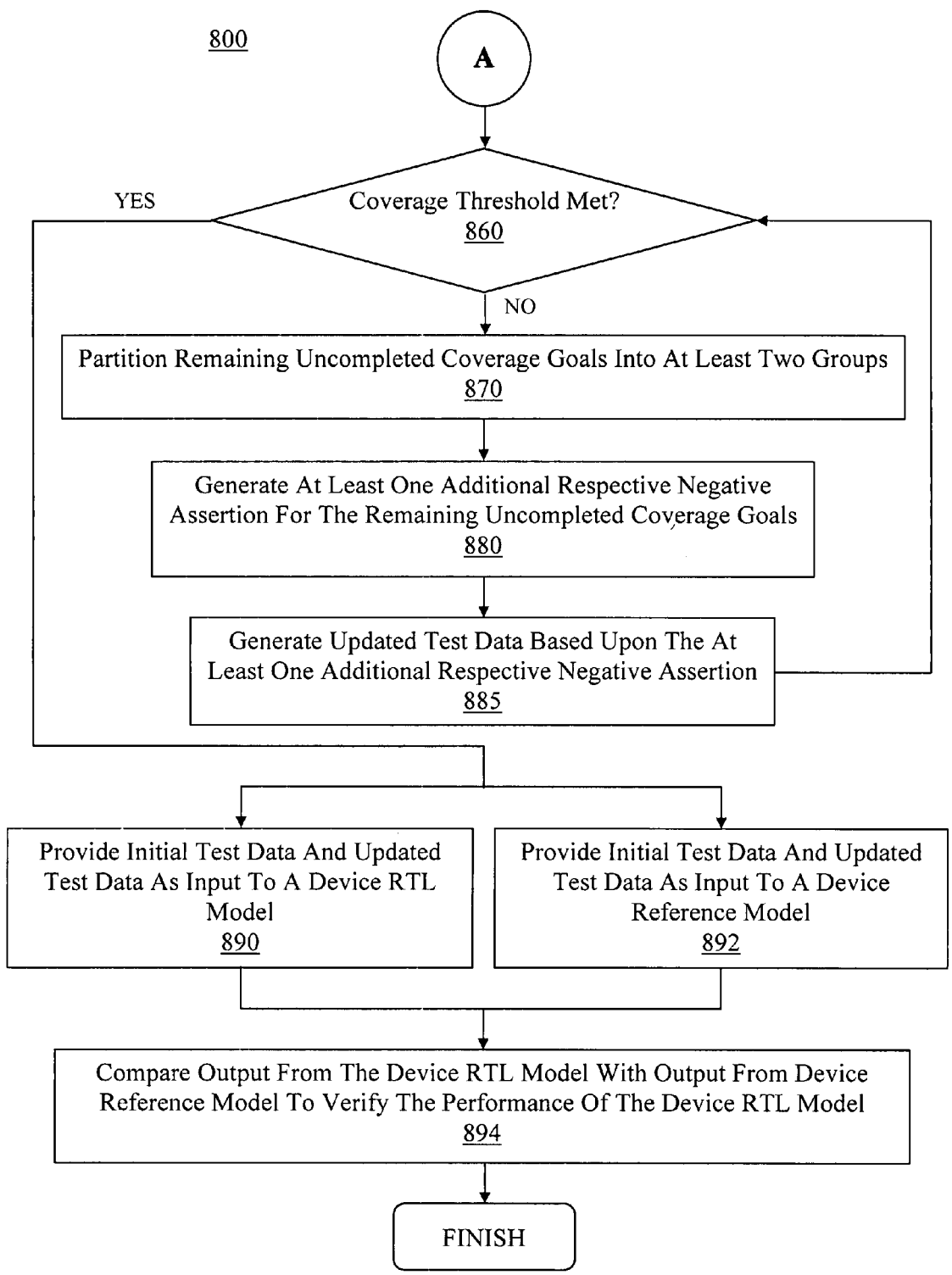
FIG. 8B shows a second portion of an exemplary computer-implemented process for partitioning of coverage goals in accordance with one embodiment of the present invention.

FIGS. 8A and 8B show exemplary computer-implemented process 800 for partitioning of coverage goals in accordance with one embodiment of the present invention. As shown in FIG. 8A, step 810 involves accessing initial test data (e.g., 110, 110a, 110b, etc.). Step 810 may be performed analogously to step 410 of FIG. 4A, step 610 of FIG. 6A, etc. in one embodiment.

Step 820 involves simulating processing of the initial test data by a device model. In one embodiment, the device model may comprise an RTL model (e.g., 120) and step 820 may be performed analogously to step 420 of FIG. 4A. Alternatively, the device model may comprise a reference model (e.g., 130) and step 820 may be performed analogously to step 620 of FIG. 6A.

As shown in FIG. 8A, step 830 involves determining a plurality of uncompleted coverage goals based upon the simulated processing of the test data (e.g., 110, 110a, 110b, etc.). The plurality of uncompleted coverage goals may comprise at least one code coverage goal and/or at least one functional coverage goal. Additionally, the plurality of uncompleted coverage goals may be determined by a coverage meter (e.g., 230) in one embodiment.

Step 835 involves partitioning the plurality of uncompleted coverage goals (e.g., 705) into at least two groups. The partitioning may be performed by a partitioning component (e.g., 710) in one embodiment. Additionally, each group of partitioned coverage goals may be allocated to a respective test data generator (e.g., 250a, 250b, etc.) in one embodiment.

As shown in FIG. 8A, step 840 involves generating at least one respective negative assertion for each of the at least two groups of uncompleted coverage goals. The negative assertions may be generated analogously to the negative assertions generated in step 440 of FIG. 4A, step 640 of FIG. 6A, etc.

Step 850 involves generating updated test data based upon the at least one respective negative assertion. The updated test data may be generated analogously to the updated test data generated in step 450 of FIG. 4A, step 650 of FIG. 6A, etc.

As shown in FIG. 8B, step 860 involves determining whether a coverage threshold has been met. The coverage threshold may be a predetermined amount of code coverage and/or functional coverage in one embodiment. Additionally, the respective coverage associated with one or more test files (e.g., generated by one or more test data generators such as test generators 250a, 250b, etc.) may be summed and compared against the coverage threshold in one embodiment. The coverage associated with each test file and/or the cumulative coverage may be determined based upon quantity of coverage goals for which test data was generated in one embodiment.

If the coverage threshold is not met, then the remaining uncompleted coverage goals (e.g., 715) may be partitioned into at least two groups in step 870. The partitioning may be performed by a partitioning component (e.g., 720) in one embodiment. Each group of partitioned coverage goals may be allocated to a respective test data generator (e.g., 250c, 250d, etc.) in one embodiment.

As shown in FIG. 8B, step 880 involves generating at least one additional respective negative assertion for the remaining uncompleted coverage goals. Step 880 may be performed analogously to step 840 in one embodiment.

Step 885 involves generating updated test data based upon the at least one additional respective negative assertion. Step 885 may be performed analogously to step 850 in one embodiment. Thereafter, steps 860 through 885 may be repeated in one embodiment.

If the coverage threshold is met in step 860, then steps 890 and 892 may be performed. Step 890 involves providing the initial test data and the updated test data as input to an RTL model (e.g., 120). Step 892 involves providing the initial test data and the updated test data as input to a reference model (e.g., 130). Thereafter, the output from simulation of the RTL model may be compared with the output from simulation of the reference model in step 894 to verify the performance of the RTL model.

FIG. 9 shows exemplary computer system platform 900 upon which embodiments of the present invention may be implemented. As shown in FIG. 9, portions of the present invention are comprised of computer-readable and computer-executable instructions that reside, for example, in computer system platform 900 and which may be used as a part of a general purpose computer network (not shown). It is appreciated that computer system platform 900 of FIG. 9 is merely exemplary. As such, the present invention can operate within a number of different systems including, but not limited to, general-purpose computer systems, embedded computer systems, laptop computer systems, hand-held computer systems, portable computer systems, stand-alone computer systems, or game consoles.

In one embodiment, depicted by dashed lines 930, computer system platform 900 may comprise at least one processor 910 and at least one memory 920. Processor 910 may comprise a central processing unit (CPU) or other type of processor. Depending on the configuration and/or type of computer system environment, memory 920 may comprise volatile memory (e.g., RAM), non-volatile memory (e.g., ROM, flash memory, etc.), or some combination of the two. Additionally, memory 920 may be removable, non-removable, etc.

In other embodiments, computer system platform 900 may comprise additional storage (e.g., removable storage 940, non-removable storage 945, etc.). Removable storage 940 and/or non-removable storage 945 may comprise volatile memory, non-volatile memory, or any combination thereof. Additionally, removable storage 940 and/or non-removable storage 945 may comprise CD-ROM, digital versatile disks (DVD) or other optical storage, magnetic cassettes, magnetic tape, magnetic disk storage or other magnetic storage devices, or any other medium which can be used to store information for access by computer system platform 900.

As shown in FIG. 9, computer system platform 900 may communicate with other systems, components, or devices via communication interface 970. Communication interface 970 may embody computer readable instructions, data structures, program modules or other data in a modulated data signal (e.g., a carrier wave) or other transport mechanism. By way of example, and not limitation, communication interface 970 may couple to wired media (e.g., a wired network, direct-wired connection, etc.) and/or wireless media (e.g., a wireless network, a wireless connection utilizing acoustic, RF, infrared, or other wireless signaling, etc.). Communication interface 970 may also couple computer system platform 100 to one or more input devices (e.g., a keyboard, mouse, pen, voice input device, touch input device, etc.) and/or output devices (e.g., a display, speaker, printer, etc.).

Graphics processor 950 may perform graphics processing operations on graphical data stored in frame buffer 960 or another memory (e.g., 920, 940, 945, etc.) of computer system platform 900. In one embodiment, graphics processor 950 and processor 910 may be combined into a single unit (e.g., thereby forming a general purpose processor). Graphical data stored in frame buffer 960 may be accessed, processed, and/or modified by components (e.g., graphics processor 950, processor 910, etc.) of computer system platform 100 and/or components of other systems/devices. Additionally, the graphical data may be accessed (e.g., by graphics processor 950) and displayed on an output device coupled to computer system platform 900. Accordingly, one or more processors (e.g., processor 930, graphics processor 950, a hybrid processor formed by processor 930 and graphics processor 950, etc.) may access and/or execute instructions stored in a memory accessible to computer system platform 900 (e.g., 920, 940, 945, a memory accessed via communication interface 970, etc.) for performing a method of automatically generating test data for a device model and/or a method of verifying a device RTL model (e.g., as discussed with respect to other Figures of the present application).

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A computer-implemented method of generating test data for verification of a device model, said method comprising:
simulating initial test data applied to said device model;
determining an uncompleted coverage goal based upon said simulating;
generating at least one negative assertion based upon said uncompleted coverage goal; and
generating updated test data based upon said at least one negative assertion, wherein said generating updated test data further comprises generating test data operable to falsify said at least one negative assertion, wherein said updated test data is operable to complete said uncompleted coverage goal during simulation of said updated test data applied to said device model.

2. The method of claim 1, wherein said device model is selected from a group consisting of a device RTL model and a device reference model.

3. The method of claim 1, wherein said simulating is performed by a simulator, wherein said determining said uncompleted coverage goal is performed by a coverage monitor coupled to said simulator, and wherein said generating said updated test data is performed by a verification tool operating on said device model and coupled to said simulator.

4. The method of claim 1, wherein said uncompleted coverage goal is selected from a group consisting of an uncompleted code coverage goal and an uncompleted functional coverage goal.

5. The method of claim 1 further comprising:
simulating said updated test data applied to said device model;
determining if a coverage threshold is met based upon said simulating of said updated test data; and
if said coverage threshold is not met:
determining an additional uncompleted coverage goal based upon said simulating of said updated test data;
generating at least one additional negative assertion based upon said additional uncompleted coverage goal; and
generating additional updated test data based upon said at least one additional negative assertion, wherein said updated test data is operable to complete said additional uncompleted coverage goal during simulation of said additional updated test data applied to said device model.

6. The method of claim 5, wherein said generating said updated test data and said generating said additional updated test data is performed by a verification tool operating on said device model.

7. The method of claim 1 further comprising:
determining a plurality of uncompleted coverage goals based upon said simulating of said test data;
partitioning said plurality of uncompleted coverage goals into at least two groups of uncompleted coverage goals;
generating at least one respective negative assertion for each of said at least two groups of uncompleted coverage goals, wherein said at least one respective negative assertion is based upon said plurality of uncompleted coverage goals; and
generating additional updated test data based upon said at least one respective negative assertion, wherein said additional updated test data is operable to complete an uncompleted coverage goal of said plurality of uncompleted coverage goals during simulation of said updated test data applied to said device model.

8. A computer-implemented method of verifying a device RTL model, said method comprising:
simulating initial test data applied to said device RTL model;
determining an uncompleted coverage goal based upon said simulating;

generating at least one negative assertion based upon said uncompleted coverage goal;

generating updated test data based upon said at least one negative assertion, wherein said generating updated test data further comprises generating test data operable to falsify said at least one negative assertion, wherein said updated test data is operable to complete said uncompleted coverage goal during simulation of said updated test data applied to said device RTL model;

providing said initial test data and said updated test data as input to said device RTL model;

providing said initial test data and said updated test data as input to a device reference model associated with said device RTL model; and comparing output from simulation of said device RTL model with output from simulation of said device reference model to verify said device RTL model.

9. The method of claim 8, wherein said device model is selected from a group consisting of said device RTL model and said device reference model.

10. The method of claim 8, wherein said device model comprises a model of at least one unit of a graphics processor.

11. The method of claim 8, wherein said simulating is performed by a simulator, wherein said determining said uncompleted coverage goal is performed by a coverage monitor coupled to said simulator, and wherein said generating said updated test data is performed by a verification tool operating on said device model and coupled to said simulator.

12. The method of claim 8, wherein said uncompleted coverage goal is selected from a group consisting of an uncompleted code coverage goal and an uncompleted functional coverage goal.

13. The method of claim 8 further comprising:
simulating said updated test data applied to said device model;
determining if a coverage threshold is met based upon said simulating of said updated test data; and
if said coverage threshold is not met:
determining an additional uncompleted coverage goal based upon said simulating of said updated test data;
generating at least one additional negative assertion based upon said additional uncompleted coverage goal; and
generating additional updated test data based upon said at least one additional negative assertion, wherein said updated test data is operable to complete said additional uncompleted coverage goal during simulation of said additional updated test data applied to said device model.

14. The method of claim 8 further comprising:
determining a plurality of uncompleted coverage goals based upon said simulating of said test data;
partitioning said plurality of uncompleted coverage goals into at least two groups of uncompleted coverage goals;
generating at least one respective negative assertion for each of said at least two groups of uncompleted coverage goals, wherein said at least one respective negative assertion is based upon said plurality of uncompleted coverage goals; and
generating additional updated test data based upon said at least one respective negative assertion, wherein said additional updated test data is operable to complete an uncompleted coverage goal of said plurality of uncompleted coverage goals during simulation of said updated test data applied to said device model.

15. A computer system comprising a processor and a memory, wherein said memory comprises instructions that when executed on said processor implement a method of generating test data for verification of a device model, said method comprising:
simulating initial test data applied to said device model;
determining an uncompleted coverage goal based upon said simulating;
generating at least one negative assertion based upon said uncompleted coverage goal; and
generating updated test data based upon said at least one negative assertion, wherein said generating updated test data further comprises generating test data operable to falsify said at least one negative assertion, wherein said updated test data is operable to complete said uncompleted coverage goal during simulation of said updated test data applied to said device model.

16. The computer system of claim 15, wherein said device model is selected from a group consisting of a device RTL model and a device reference model.

17. The computer system of claim 15, wherein said device model comprises a model of at least one unit of a graphics processor.

18. The computer system of claim 15, wherein said simulating is performed by a simulator, wherein said determining said uncompleted coverage goal is performed by a coverage monitor coupled to said simulator, and wherein said generating said updated test data is performed by a verification tool operating on said device model and coupled to said simulator.

19. The computer system of claim 15, wherein said uncompleted coverage goal is selected from a group consisting of an uncompleted code coverage goal and an uncompleted functional coverage goal.

20. The computer system of claim 15, wherein said method further comprises:
simulating said updated test data applied to said device model;
determining if a coverage threshold is met based upon said simulating of said updated test data; and
if said coverage threshold is not met:
determining an additional uncompleted coverage goal based upon said simulating of said updated test data;
generating at least one additional negative assertion based upon said additional uncompleted coverage goal; and
generating additional updated test data based upon said at least one additional negative assertion, wherein said updated test data is operable to complete said additional uncompleted coverage goal during simulation of said additional updated test data applied to said device model.

21. The computer system of claim 20, wherein said generating said updated test data and said generating said additional updated test data is performed by a verification tool operating on said device model.

22. The computer system of claim 15, wherein said method further comprises:
determining a plurality of uncompleted coverage goals based upon said simulating of said test data;
partitioning said plurality of uncompleted coverage goals into at least two groups of uncompleted coverage goals;
generating at least one respective negative assertion for each of said at least two groups of uncompleted coverage goals, wherein said at least one respective negative assertion is based upon said plurality of uncompleted coverage goals; and
generating additional updated test data based upon said at least one respective negative assertion, wherein said additional updated test data is operable to complete an uncompleted coverage goal of said plurality of uncompleted coverage goals during simulation of said updated test data applied to said device model.

23. The computer system of claim 15, wherein said method further comprises:
providing said initial test data and said updated test data as input to a device RTL model associated with said device model;

providing said initial test data and said updated test data as input to a device reference model associated with said device model; and comparing output from simulation of said device RTL model with output from simulation of said device reference model to verify said device RTL model.

* * * * *